United States Patent
Scheiermann et al.

(10) Patent No.: US 10,012,669 B2
(45) Date of Patent: Jul. 3, 2018

(54) DEVICE AND METHOD FOR DETERMINING A STATE OF AN OBJECT WHICH IS TO BE MONITORED

(71) Applicant: Robert Bosch GmbH, Stuttgart (DE)

(72) Inventors: Sergej Scheiermann, Stuttgart (DE); Rolf Kaack, Reutlingen (DE)

(73) Assignee: ROBRET BOSCH GMBH, Stuttgart (DE)

( * ) Notice: Subject to any disclaimer, the term of this patent is extended or adjusted under 35 U.S.C. 154(b) by 0 days.

(21) Appl. No.: 15/021,069

(22) PCT Filed: Aug. 25, 2014

(86) PCT No.: PCT/EP2014/067977
§ 371 (c)(1),
(2) Date: Mar. 10, 2016

(87) PCT Pub. No.: WO2015/051942
PCT Pub. Date: Apr. 16, 2015

(65) Prior Publication Data
US 2016/0231349 A1    Aug. 11, 2016

(30) Foreign Application Priority Data
Oct. 7, 2013    (DE) .................. 10 2013 220 176

(51) Int. Cl.
*G01P 13/00*    (2006.01)
*G08B 13/08*    (2006.01)
(Continued)

(52) U.S. Cl.
CPC ............... *G01P 13/00* (2013.01); *G01D 5/14* (2013.01); *G01P 1/07* (2013.01); *G01P 15/18* (2013.01);
(Continued)

(58) Field of Classification Search
CPC .............................. G08B 13/08; G08B 13/00
See application file for complete search history.

(56) References Cited

U.S. PATENT DOCUMENTS 5,202,661 A *  4/1993  Everett, Jr. ......... G05D 1/0255
                                                340/522
6,472,993 B1   10/2002  Addy
(Continued)

FOREIGN PATENT DOCUMENTS

CN    101772320 A    7/2010
CN    102426738 A    4/2012
(Continued)

OTHER PUBLICATIONS

International Search Report for PCT/EP2014/067977, dated Dec. 15, 2014.

*Primary Examiner* — Hongmin Fan
(74) *Attorney, Agent, or Firm* — Norton Rose Fulbright US LLP; Gerard Messina

(57) ABSTRACT

A device and a method for determining states of an object to be monitored, such as a window or a door. The measurement values of a plurality of sensors, in particular a magnetometer and an acceleration sensor, are merged and are evaluated together. For the determination of a new state from a group of predefined states, only state transitions that are actually possible are taken into account. State transitions that are not possible or are not allowed are not taken into account.

12 Claims, 2 Drawing Sheets

(51) Int. Cl.
*G01D 5/14* (2006.01)
*G01P 1/07* (2006.01)
*G01P 15/18* (2013.01)
*G01R 33/02* (2006.01)

(52) U.S. Cl.
CPC ......... *G01R 33/0206* (2013.01); *G08B 13/08* (2013.01)

(56) References Cited

U.S. PATENT DOCUMENTS

| | | | | |
|---|---|---|---|---|
| 2003/0071739 | A1* | 4/2003 | Addy | G08B 13/08 340/686.1 |
| 2008/0284596 | A1* | 11/2008 | Montague | E06B 9/01 340/545.8 |
| 2010/0019902 | A1 | 1/2010 | Mullet | |
| 2015/0206682 | A1* | 7/2015 | Sala | G06F 1/325 307/112 |

FOREIGN PATENT DOCUMENTS

| | | |
|---|---|---|
| CN | 103035095 A | 4/2013 |
| CN | 103093563 A | 5/2013 |
| DE | 10335126 | 3/2005 |
| DE | 102006030986 | 1/2008 |
| DE | 102008022276 | 11/2009 |
| DE | 202010010852 | 11/2011 |
| JP | H1061273 A | 3/1998 |
| JP | 2010522344 A | 7/2010 |
| JP | 2010182082 A | 8/2010 |
| JP | 2010182085 A | 8/2010 |
| JP | 2012026824 A | 2/2012 |
| JP | 2012052937 A | 3/2012 |
| JP | 2012212364 A | 11/2012 |
| WO | 2003034364 A1 | 4/2003 |
| WO | WO 2008/048287 | 4/2008 |
| WO | 2009008411 A1 | 1/2009 |
| WO | 2010011341 A1 | 1/2010 |
| WO | WO 2011/141056 | 11/2011 |
| WO | 2013069967 A1 | 5/2013 |

* cited by examiner

DEVICE AND METHOD FOR DETERMINING A STATE OF AN OBJECT WHICH IS TO BE MONITORED

FIELD

The present invention relates to a device and to a method for determining a state of an object that is to be monitored.

BACKGROUND INFORMATION

Sensors for monitoring states of doors and windows are conventional. Generally, these conventional sensors are realized in two parts. A first part of the sensor is made up of a permanent magnet. A second part of the sensor has a magnetic sensor, for example a reed contact, that can be opened or closed by the permanent magnet in the first part of the sensor. Here, a part of the sensor has to be attached to the movable frame of the window or door that is to be monitored, and the other part of the sensor has to be fastened outside the movable frame, for example on the wall. If the door or window is closed, then the reed contact is triggered by the magnetic field of the permanent magnet. If the door or the window is open, the reed contact is not triggered.

German Patent Application No. DE 103 35 126 A1 describes a device for state monitoring of an object in which a reed contact can be triggered by a permanent magnet. The device also has a transmit unit by which the ascertained state of the object, or a state change, can be communicated.

There is therefore a need for a device, realized having one part, for monitoring the state of an object.

SUMMARY

According to a first aspect, the present invention provides a device for ascertaining a state of an object that is to be monitored, having a magnetometer that is designed to acquire a magnetic field and to provide a first measurement value as a function of the acquired magnetic field; an acceleration sensor that is designed to acquire an acceleration and to provide a second measurement value as a function of the acquired acceleration; and a processing device that is designed to determine a state of the object that is to be monitored from a plurality of predefined states, using the measurement values provided by the magnetometer and/or by the acceleration sensor.

In addition, according to a further aspect the present invention, a method is provided for ascertaining a state of an object, having the steps of acquiring a magnetic field and of providing a first measurement value corresponding to the magnetic field; of acquiring an acceleration of the object to be monitored and providing a second measurement value corresponding to the acquired acceleration; and of determining a state of the object to be monitored from a plurality of predefined states, using the first measurement value corresponding to the acquired magnetic field and/or using the second measurement value corresponding to the acquired acceleration.

In accordance with the present invention, a one-part design is provided for a device for monitoring the state of objects. For this purpose, all components required for such a state monitoring are situated in a common housing. For the monitoring of the states, measurement values of sensors are used that are capable of determining a movement and/or a change of position in space without the use of further auxiliary means, such as additional permanent magnets or the like. Here, the measurement values of a plurality of such sensors are merged with one another.

The device and the method for ascertaining a state of an object further follow the approach that the monitored object can only be in one of a plurality of previously defined states. Thus, on the basis of the measurement values provided by the sensors, one of these predetermined states can be selected as the new state of the object. Here, the reliability of the ascertaining of a state can be further increased, when determining a new state, by including in each case the currently determined state of the object in the determination of the new state.

In addition, for the determination of a new state of the object the possibility of the state transitions from a current state to a new state can also be defined and limited. In this way, allowed or non-allowed state transitions can be defined. In this way, the reliability of the ascertaining of the state can be improved, because state transitions that are not allowed can be excluded from the outset.

In this way, an efficient and very reliable monitoring of the state of objects can be achieved, using a sensor realized in one part.

In a specific embodiment, the device also has a memory device that is designed to store a state determined by the processing device, and to store measurement values from the magnetometer and/or acceleration sensor corresponding to the determined state of the object.

These stored data can not only be stored for logging purposes, but in particular are also used as data for a successive calibration of the state monitoring. The stored determined states and the measurement values corresponding thereto can for example be limited to a prespecified number of data sets. Here, when there is the addition of a further data set, preferably the oldest previously stored data set can be deleted.

In a specific embodiment, the processing device determines the state of the object to be monitored using the states stored in the memory device and the corresponding measurement values. Through the use of these data stored in the memory device, the determination of the states of the object to be monitored can be continuously improved. In particular, in this way a permanent adaptation and recalibration of the state monitoring to changing external influences is also possible. Thus, the state monitoring can operate correctly even when the device is placed anew on the object to be monitored, or the device is situated on a different object to be monitored.

In a specific embodiment, the device further includes a communication interface that is designed to transmit the state determined by the processing device. Through this communication interface, the determined states and state changes can be forwarded. For example, a transmission of the data of a determined state to a central building monitoring system is possible.

In a specific embodiment, the communication interface wirelessly transmits the state determined by the processing device. Such a wireless data transmission enables a very convenient forwarding of the ascertained state data, in particular in the case of movable objects.

In a specific embodiment, the magnetometer and/or the acceleration sensor can be deactivated by the processing device. In this way, for example a state change of the object can at first be monitored by only one sensor. As soon as this one sensor detects a possible state change, the processing device can thereupon also activate the further sensor. In this way, on the one hand a particularly energy-saving monitoring of the object is possible, while at the same time, through the activation of additional sensors on an as-needed basis, a reliable determination of state changes can be carried out.

In a specific embodiment, the monitored object is a door or a window. Preferably, the predefined states here include the states open, closed, and tilted. Doors and windows are objects that are particularly well-suited for the state monitoring according to the present invention, due to their clearly defined number of possible states.

In a specific embodiment of the method for ascertaining a state of an object, the step of determining a state determines a probability for each predefined state, and thereupon determines the state having the highest probability. In this way, an efficient and reliable ascertaining of states and state transitions can be carried out.

The present invention further includes a building management system having a device according to the present invention for ascertaining a state of an object to be monitored.

BRIEF DESCRIPTION OF THE DRAWINGS

Further specific embodiments and advantages of the present invention result from the description below, with reference to the figures.

DETAILED DESCRIPTION OF EXAMPLE EMBODIMENTS

Figure 1:
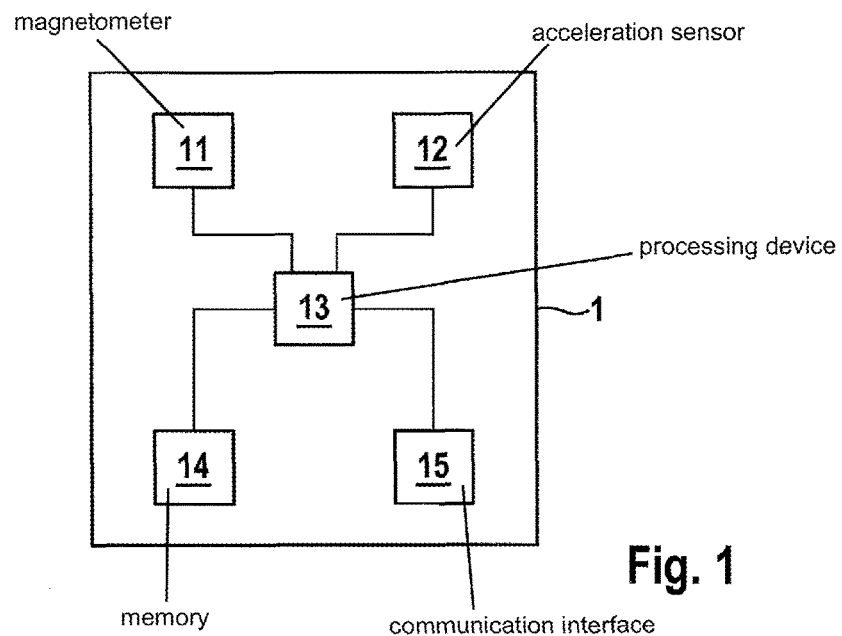
FIG. 1 shows a schematic representation of a block diagram of a device for ascertaining a state of an object to be monitored, according to a specific embodiment.

FIG. 1 shows a schematic representation of a block diagram of a device 1 for ascertaining a state of an object to be monitored according to a specific embodiment. Device 1 includes a magnetometer 11 and an acceleration sensor 12 that are connected to a processing device 13. This processing device 13 is further connected to a memory 14 and to a communication interface 15.

Magnetometer 11 is preferably a three-axis magnetometer. Such a magnetometer acquires a magnetic field in all three spatial directions. In particular, such a magnetometer is capable of separately detecting changes in the magnetic field in one or more spatial directions. Magnetometer 11 forwards its measurement results to processing device 13 in the form of measurement signals.

Through continuous monitoring of a static magnetic field, such as the Earth's magnetic field, magnetometer 11 can thus recognize a movement of magnetometer 11 within this magnetic field.

Acceleration sensor 12 is likewise preferably a three-axis acceleration sensor that can acquire both positive and negative accelerations in all three spatial directions. Acceleration sensor 12 forwards its measurement results to processing device 13, likewise in the form of measurement signals.

In order to reduce the energy consumption of device 1 for ascertaining a state, processing device 13 can, in a ready state, at first deactivate one of the two sensors 11 or 12. For example, at first magnetometer 11 can be deactivated, and the object to be monitored is then monitored exclusively by acceleration sensor 12. If acceleration sensor 12 recognizes a movement and thereupon sends a corresponding signal to processing unit 13, then magnetometer 11 is thereupon activated and also supplies measurement values to processing unit 13.

Alternatively, it is also possible first to deactivate acceleration sensor 12 and to evaluate only measurement signals from magnetometer 11. In this case, acceleration sensor 12 can be activated after magnetometer 11 has recognized a movement of the object to be monitored, and the measurement signals of acceleration sensor 12 can also be evaluated together with the measurement signals of magnetometer 11.

If processing device 13 receives from magnetometer 11 and/or acceleration sensor 12 measurement signals that indicate a movement of the object to be monitored, these signals are then evaluated by processing device 13, and a possible new state of the object to be monitored is thereupon determined. Here, the measurement signals of magnetometer 11 and of acceleration sensor 12 are evaluated together.

Here, processing device 13 analyzes the measurement signals provided by magnetometer 11 and by acceleration sensor 12, and thereupon determines, from a plurality of predefined possible states of the object to be monitored, a possible new state of the object to be monitored, using the provided measurement signals.

If the object to be monitored is for example a window, then this object can normally have three possible states: closed, open, or tilted.

Figure 2:
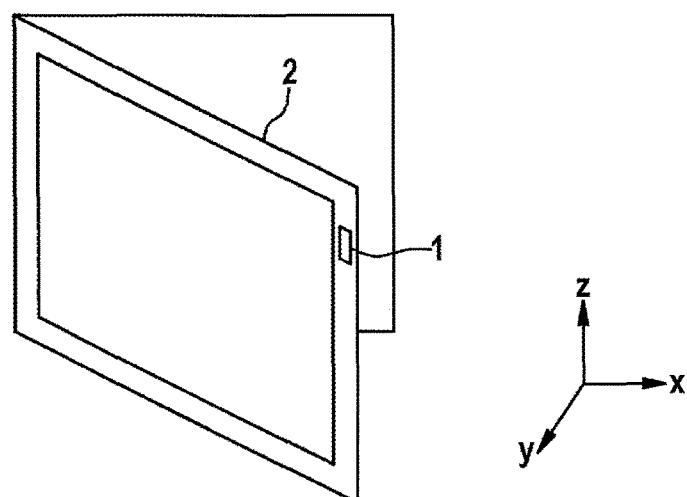
FIG. 2 shows a schematic representation of a device for ascertaining a state according to a further specific embodiment on an open window.

FIG. 2 shows a window 2 in an open state. A device 1 for ascertaining a state is attached to window 2. In order to open window 2, the window is rotated about the Z axis at the hinges (not shown).

Figure 3:
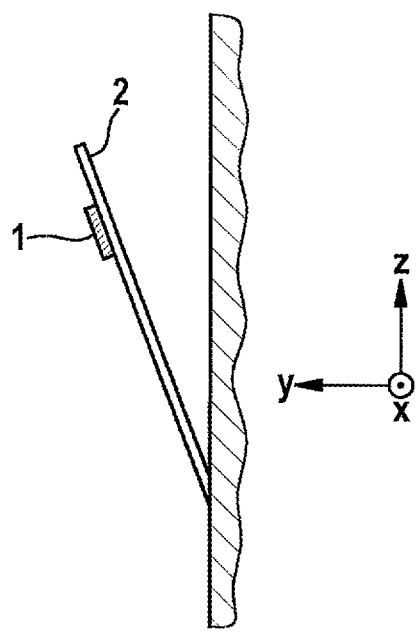
FIG. 3 shows a schematic representation of a device for ascertaining a state according to a further specific embodiment on a tilted window.

FIG. 3 shows a window 2 in a tilted state. Here, window 2 is inclined about the X axis at further hinges (also not shown).

The window shown in FIGS. 2 and 3 can thus assume the three states open, closed, or tilted; here it is not possible to make a transition immediately from each state to each other state. For example, if window 2 is in an open state, a transition cannot be made immediately to the tilted state. Rather, it is necessary for window 2 first to be closed. Likewise, conversely, from the tilted state it is possible to make a transition only to the closed state. Only then can window 2 be opened.

Processing device 13 takes into account these further necessary conditions by which allowed or non-allowed state transitions are defined. Therefore, given a known current state of object 2 to be monitored, processing device 13 will determine, using the provided measurement signals, only those new states that are allowed according to the predefined necessary conditions. Non-allowed state transitions, which would exclude one or more of the predefined states starting from the currently determined state, here have the result that the corresponding excluded predefined states cannot be determined as new states.

For the determination of the new states of object 2 to be monitored, processing device 13 can calculate a respective probability value for all predefined states, preferably at least for all allowed predefined new states, based on the provided measurement signals. For the calculation of the probabilities for the predefined states, for example the signal curves of magnetometer 11 and/or of acceleration sensor 12 during a time span can be analyzed. Here, the signal curves for all spatial directions can be analyzed separately, or also together if warranted. An evaluation of the magnitudes of the signal curves for all spatial directions, together or separately, is also possible. In addition, processing device 13 can also evaluate only a change in the measurement values of magnetometer 11 and/or acceleration sensor 12. Here as well, an evaluation of the measurement values for all spatial directions together or separately is possible. It is likewise possible here to evaluate only the magnitudes of the measurement values.

For example, when there is a state change from a closed window 2 to an open window 2, an acceleration is detected in the Y direction and in the X direction, while in the Z direction the acceleration is (close to) zero.

Magnetometer 11 can here also detect a corresponding variation of the Earth's magnetic field, which is monitored, through the change in position of device 1.

Processing device 13 can immediately evaluate the measurement signals of magnetometer 11 and acceleration sensor 12, and, based on predefined rules, can thereupon ascertain one of the predetermined states of object 2 to be monitored.

In addition, it is also possible to use previous measurement values of magnetometer 11 and acceleration sensor 12 for the ascertaining of the states of object 2 to be monitored. For this purpose, the previous measurement values from magnetometer 11 and acceleration sensor 12 can be stored in memory device 14. Processing device 13 can read out these stored measurement values and the corresponding state of the object, and can use them to ascertain a new state of the object.

For example, the measurement values or signal curves currently provided by magnetometer 11 and acceleration sensor 12 can be compared with previously stored reference values. For example, a correlation function or some other analysis can be calculated in order to compare the current measurement values with the reference values. For this purpose, the mean value of a plurality of reference values can also be compared with the current measurement values.

For example, for each of the predefined possible states of object 2 to be monitored, a matrix X having measurement values can be stored, as shown in the following equation:

$$X(\text{state}) = \begin{pmatrix} A_{x1} & A_{y1} & A_{z1} & M_{x1} & M_{x1} & M_{z1} \\ A_{x2} & A_{y2} & A_{z2} & M_{x2} & M_{y2} & M_{x1} \\ A_{xN} & A_{yN} & A_{zN} & M_{xN} & M_{yN} & M_{zN} \end{pmatrix}$$

where $A_{xi}$, $A_{yi}$, and $A_{zi}$ are the respective measurement values of acceleration sensor 12, and $M_{xi}$, $M_{yi}$, and $M_{zi}$ are the respective measurement values of magnetometer 11, in the respective spatial directions X, Y, and Z. The index i designates the individual measurements. The expression "state" stands for the individual predefined states that the object being monitored can assume. If the maximum storage capacity of memory 14 has been reached, and there takes place a further measurement or state determination, then preferably the row having the oldest measurement is deleted and all further rows are each shifted downward by a row, so that the newest measurement can be inserted in the first row.

Preferably, for each predefined state of object 2 to be monitored, a separate matrix X (state) is created.

In this way, device 1 for ascertaining the state of an object can automatically calibrate itself during operation. In this way, no specific adaptation of this device 1 to the particular location of use is required ahead of time. If the boundary conditions change during operation, device 1 can automatically adapt to the changed boundary conditions. Thus, for example a metallic body situated nearby, for example a cabinet, can cause changes in the Earth's magnetic field detected by magnetometer 11. Through successive automatic calibration, this disturbance can however be compensated very quickly. Wear-related phenomena that may occur at the joints along which window 2 being monitored moves, which could cause variations in acceleration during opening, closing, and tilting of a window 2, are also compensated in this way.

The states of object 2 to be monitored that are ascertained by processing device 13 can be forwarded to a communication interface 15. Communication interface 15 thereupon transmits the ascertained states, or an ascertained change of state, to a suitable receiver. In principle, here a transmission of data via cable is possible. In this case, the supply of energy to device 1 can also simultaneously take place via the cable-bound data transmission.

Preferably, however, the data transmission from communication interface 15 to the receiver takes place via a wireless radio connection. For example, the data transmission can take place using a conventional protocol such as DECT, Bluetooth, WLAN, etc. In this case, device 1 is preferably supplied with power by a battery.

The receiver can for example be a local radio receiver, or preferably the receiver of a central building management system. Preferably, the corresponding receiver can receive and evaluate the radio signals of a plurality of devices 1 for ascertaining states of objects to be monitored. Here, in particular given wireless transmission, an automatic networking of the individual devices 1 among one another, and/or with the central receive location, is also possible.

Figure 4:
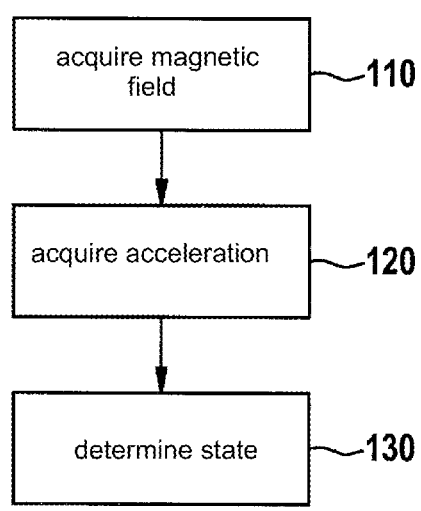
FIG. 4 shows a schematic representation of a method for ascertaining a state, forming the basis of a further specific embodiment of the present invention.

FIG. 4 shows a schematic representation of the sequence of a method 100 for ascertaining a state of an object to be monitored. In step 110, a magnetic field, preferably the Earth's magnetic field, is acquired and a measurement value corresponding to the acquired magnetic field is provided. In step 120, an acceleration of the object to be monitored is acquired and a second measurement value corresponding to the acquired acceleration is provided. Thereupon, in step 130, a state of the object being monitored is determined from a plurality of predefined states, using the first measurement value corresponding to the acquired magnetic field and/or the second measurement value corresponding to the acquired acceleration.

Step 130 can preferably calculate a probability for each of the predefined states. Preferably, probabilities are calculated only for the possible states, which are possible starting from the current state of the object as previously determined. Subsequently, in this case the state having the highest probability is determined as the new state of the object to be monitored.

In sum, the present invention relates to a device and a method for determining states of an object to be monitored such as a window or a door. The measurement values of a plurality of sensors, in particular a magnetometer and an acceleration sensor, are merged and are evaluated together. In order to determine a new state from a group of predefined states, only actually possible state transitions are taken into account. State transitions that are not possible or that are not allowed are not taken into account.

What is claimed is:
1. A device for ascertaining a state of an object to be monitored, comprising:
   a magnetometer designed to acquire a magnetic field and to provide a first measurement value as a function of the acquired magnetic field;

an acceleration sensor designed to acquire an acceleration and to provide a second measurement value as a function of the acquired acceleration; and a processing device designed to determine, from a plurality of predefined states, a state of the object to be monitored using measurement values provided by at least one of the magnetometer and by the acceleration sensor, wherein:

the processing device controls the magnetometer and the acceleration sensor in such a way that the processing device activates only one of the two and deactivates the other, as soon as the processing device detects a possible change in state, the processing device activates the other one, and the processing device determines from a current state of the object which state transition is allowed from the current state and which state transition is not allowed from the current state.

2. The device as recited in claim 1, further comprising:
a memory to store a state determined by the processing device and to store measurement values, corresponding to the determined state of the object, from the at least one of the magnetometer and the acceleration sensor.

3. The device as recited in claim 2, wherein the processing device determines the state of the object to be monitored using states stored in the memory and corresponding measurement values.

4. The device as recited in claim 1, further comprising:
a communication interface designed to transmit the state determined by the processing device.

5. The device as recited in claim 4, wherein the communication interface is designed to wirelessly transmit the state determined by the processing device.

6. The device as recited in claim 1, wherein the object to be monitored is a door or a window.

7. The device as recited in claim 1, wherein the processing device includes a first input for receiving an output signal containing a measurement value from the magnetometer and a second input for receiving an output signal containing a measurement value from the acceleration sensor.

8. A building management system including a device for ascertaining the state of an object to be monitored, the device comprising:

a magnetometer designed to acquire a magnetic field and to provide a first measurement value as a function of the acquired magnetic field;

an acceleration sensor designed to acquire an acceleration and to provide a second measurement value as a function of the acquired acceleration; and a processing device designed to determine, from a plurality of predefined states, a state of the object to be monitored using measurement values provided by at least one of the magnetometer and by the acceleration sensor, wherein:

the processing device controls the magnetometer and the acceleration sensor in such a way that the processing device activates only one of the two and deactivates the other, as soon as the processing device detects a possible change in state, the processing device activates the other one, and the processing device determines from a current state of the object which state transition is allowed from the current state and which state transition is not allowed from the current state.

9. The building management system as recited in claim 8, wherein the processing device includes a first input for receiving an output signal containing a measurement value from the magnetometer and a second input for receiving an output signal containing a measurement value from the acceleration sensor.

10. A method for ascertaining a state of an object to be monitored, comprising:

acquiring, through a magnetometer, a magnetic field and providing of a first measurement value corresponding to the acquired magnetic field;

acquiring, through an accelerometer, an acceleration of the object to be monitored and providing a second measurement value corresponding to the acquired acceleration;

determining a state of the object to be monitored from a plurality of predefined states using at least one of the first measurement value corresponding to the acquired magnetic field and the second measurement value corresponding to the acquired acceleration;

controlling the magnetometer and the acceleration sensor in such a way only one of the two is activated and the other is deactivated;

as soon a possible change in state is detected, the other one is activated; and determining from a current state of the object which state transition is allowed from the current state and which state transition is not allowed from the current state.

11. The method as recited in claim 10, wherein the determining the state includes calculating a probability for each predefined state and determining the state having a highest probability.

12. The method as recited in claim 10, further comprising:
receiving an output signal containing a measurement value from the magnetometer; and
receiving an output signal containing a measurement value from the acceleration sensor.

\* \* \* \* \*